(12) United States Patent
Cheng

(10) Patent No.: US 12,408,400 B2
(45) Date of Patent: Sep. 2, 2025

(54) SEMICONDUCTOR DEVICE AND METHOD OF FABRICATING THE SAME

(71) Applicant: WUHAN XINXIN SEMICONDUCTOR MANUFACTURING CO., LTD., Wuhan (CN)

(72) Inventor: Yajie Cheng, Wuhan (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 437 days.

(21) Appl. No.: 18/089,084

(22) Filed: Dec. 27, 2022

(65) Prior Publication Data

US 2024/0153999 A1 May 9, 2024

(30) Foreign Application Priority Data

Nov. 8, 2022 (CN) .......................... 202211393726.7

(51) Int. Cl.
| | |
|---|---|
| H01L 29/76 | (2006.01) |
| H01L 21/225 | (2006.01) |
| H01L 21/265 | (2006.01) |
| H01L 21/266 | (2006.01) |
| H01L 29/94 | (2006.01) |
| H10D 30/01 | (2025.01) |
| H10D 30/65 | (2025.01) |
| H10D 62/10 | (2025.01) |
| H10D 62/17 | (2025.01) |

(52) U.S. Cl.
CPC ....... *H10D 62/393* (2025.01); *H01L 21/2253* (2013.01); *H01L 21/26513* (2013.01); *H01L 21/266* (2013.01); *H10D 30/0281* (2025.01); *H10D 30/65* (2025.01); *H10D 62/116* (2025.01)

(58) Field of Classification Search
CPC .. H10D 62/393; H10D 30/0281; H10D 30/65; H10D 62/116; H10D 30/603; H10D 30/0221; H10D 64/516; H10D 62/157; H10D 62/124; H01L 21/2253; H01L 21/26513; H01L 21/266
USPC .......................................... 257/288
See application file for complete search history.

(56) References Cited

U.S. PATENT DOCUMENTS

| | | | | |
|---|---|---|---|---|
| 7,952,145 B2 * | 5/2011 | Korec | ................. | H02J 9/04 257/343 |
| 2015/0318293 A1 * | 11/2015 | Lee | ................. | H10B 41/47 257/392 |

* cited by examiner

*Primary Examiner* — Theresa T Doan
(74) *Attorney, Agent, or Firm* — MUNCY, GEISSLER, OLDS & LOWE, P.C.

(57) ABSTRACT

A semiconductor device and a method of fabricating the same are disclosed. The method includes: providing a substrate; forming a patterned mask layer on the substrate; and forming a drift region in the substrate by performing an ion implantation process using the patterned mask layer as a mask. The patterned mask layer has at least one opening with an overall width increasing in a direction from a source region toward a drain region, thereby a dopant ion concentration in the drift region increasing in the direction from the source region toward the drain region. With the present invention, a semiconductor device having both a relatively low on-resistance and an increased breakdown voltage can be made with a simplified process at reduced cost.

16 Claims, 7 Drawing Sheets

SEMICONDUCTOR DEVICE AND METHOD OF FABRICATING THE SAME

CROSS-REFERENCES TO RELATED APPLICATIONS

This application claims the priority of Chinese patent application number 202211393726.7, filed on Nov. 8, 2022, the entire contents of which are incorporated herein by reference.

TECHNICAL FIELD

The present invention relates to the field of semiconductor integrated circuit (IC) fabrication and, in particular, to a semiconductor device and a method of fabricating it.

BACKGROUND

Nowadays, lateral double-diffused metal oxide semiconductor (LDMOS) devices are widely used in power ICs. For LDMOS, the most important parameters are on-resistance (Ron) and breakdown voltage (BV). These parameters conflict with each other, and a lower on-resistance and a higher breakdown voltage are more desired.

Creating a dopant ion concentration in the drift region increasing in the direction from the source region toward the drain region can impart to an LDMOS device both a low on-resistance and an increased breakdown voltage. Currently, such a dopant ion concentration in the drift region increasing in the direction from the source region toward the drain region is created by a process involving multiple photolithography steps using different photomasks and multiple ion implantation steps. This process is tedious and expensive. For example, in a process involving two photolithography steps using two different photomasks and two ion implantation steps, referring to FIGS. 1a to 1b, first of all, as shown in FIG. 1a, a first photolithography step using a first photomask is performed to form a first patterned photoresist layer 121 on a substrate 11, and a first ion implantation step is performed with the first patterned photoresist layer 121 serving as a mask to form a first drift region 12 in an active area surrounded by a shallow trench isolation (STI) structure 111. Subsequently, as shown in FIG. 1b, a second photolithography step using a second photomask is carried out to form a second patterned photoresist layer 131 on the substrate 1. Since a light transmitting length of the second photomask is shorter than that of the first photomask, an opening in the second patterned photoresist layer 131 in which the surface of the substrate 11 is exposed is narrower than an opening in the first patterned photoresist layer 121 in which the surface of the substrate 11 is exposed. Thus, as a result of a second ion implantation step using the second patterned photoresist layer 131 as a mask, a second drift region 13 is formed in the first drift region 12 on the side thereof proximal toward the drain region. As the second drift region 13 undergoes one more ion implantation step than the first drift region 12, its dopant ion concentration is higher than that of the first drift region 12. That is, there is a dopant ion concentration in the drift region increasing in the direction from the source region toward the drain region in the substrate 11.

Therefore, there is an urgent need to modify the conventional drift region formation method to simplify its process and reduce its cost.

SUMMARY OF THE INVENTION

It is an objective of the present invention to provide a semiconductor device with both a low on-resistance and an increased breakdown voltage and a method of fabricating the semiconductor device with a simplified process at lower cost.

The above objective is attained by a method of fabricating a semiconductor device, which includes: providing a substrate; forming a patterned mask layer on the substrate; and forming a drift region in the substrate by performing an ion implantation process using the patterned mask layer as a mask, wherein the patterned mask layer has at least one opening with an overall width increasing in a direction from a source region toward a drain region, thereby a dopant ion concentration in the drift region increasing in the direction from the source region toward the drain region.

The above objective is also attained by a semiconductor device fabricated using the method as defined above.

BRIEF DESCRIPTION OF THE DRAWINGS

FIG. 6a is a schematic top view of a patterned mask layer formed by a photolithography process using the photomask of FIG. 4a.

FIG. 7a is a schematic top view of a patterned mask layer formed by a photolithography process using the photomask of FIG. 5a.

In FIGS. 1a to 11: 11—substrate; 111—shallow trench isolation structure; 12—first drift region; 121—first patterned photoresist layer; 13—second drift region; 131—second patterned photoresist layer; 21—substrate; 211—first filled-trench structure; 212—patterned mask layer; 213— opening; 221—first drift region; 222—second drift region; 23—bulk region; 231—bulk contact region; 24—gate dielectric layer; 25—gate layer; 26—field oxide layer; 261—high-temperature oxide layer; 262—LOCOS structure; 263—second trench isolation structure; 271—source region; 272—drain region; 28—conductive plug; 31—light-shielding region; 32—light-transmitting region.

DETAILED DESCRIPTION

Objectives, advantages and features of the present invention will become more apparent upon reading the following more detailed description of the proposed semiconductor device and method when taken in conjunction with the accompanying drawings. Note that the figures are provided in a very simplified form not necessarily drawn to exact scale for the only purpose of facilitating easy and clear description of the disclosed embodiments.

Figure 1A:
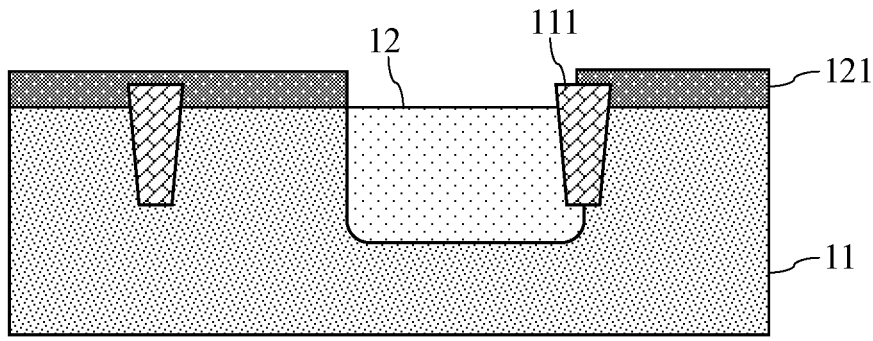
FIGS. 1a to 1b schematically illustrate a process of forming a drift region.
Figure 1B:
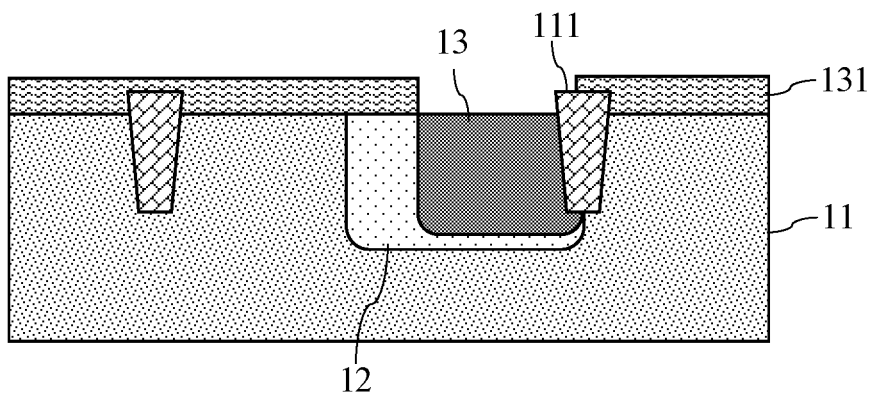
Figure 2:
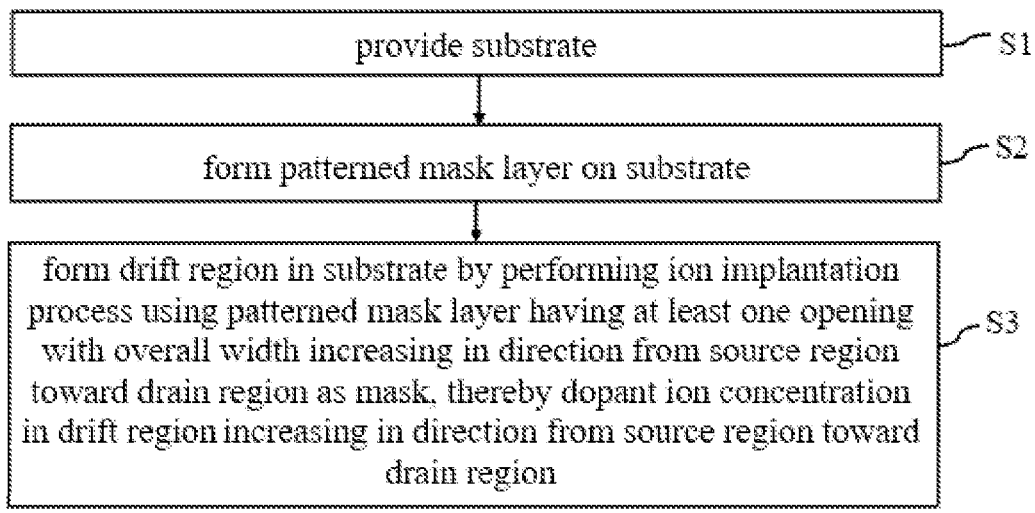
FIG. 2 is a flowchart of a method of fabricating a semiconductor device according to an embodiment of the present invention.

In an embodiment of the present invention, there is provided a method of fabricating a semiconductor device. Reference is now made to FIG. 2, which shows a flowchart of the method. The method includes:

Step S1) providing a substrate;

Step S2) forming a patterned mask layer on the substrate; and

Step S3) forming a drift region in the substrate by performing an ion implantation process using the patterned mask layer as a mask, wherein the patterned mask layer has an opening with a width increasing in a direction from a source region toward a drain region, as a result of which a dopant ion concentration increasing in the direction from the source region toward the drain region is formed in the drift region.

The method according to this embodiment will be described in greater detail below with reference to FIGS. 3*a* to 11, in which FIGS. 9*a* to 9*b* and 10 to 11 are schematic cross-sectional views of semiconductor devices shown in FIG. 8 taken along line AA'.

In Step S1, a substrate 21 is provided.

The substrate 21 has an active area surrounded by a first filled-trench structure 211. A mask layer is formed on the substrate 21.

The substrate 21 may be made of any suitable material well known to those skilled in the art.

The first filled-trench structure 211 serves for isolation. A top surface of the first filled-trench structure 211 may be higher or lower than a top surface of the substrate 21. Alternatively, the top surface of the first filled-trench structure 211 may be flush with the top surface of the substrate 21.

The mask layer may be a photosensitive material such as photoresist. When the mask layer is a photoresist layer, it may be a positive or negative photoresist layer.

Figure 3A:
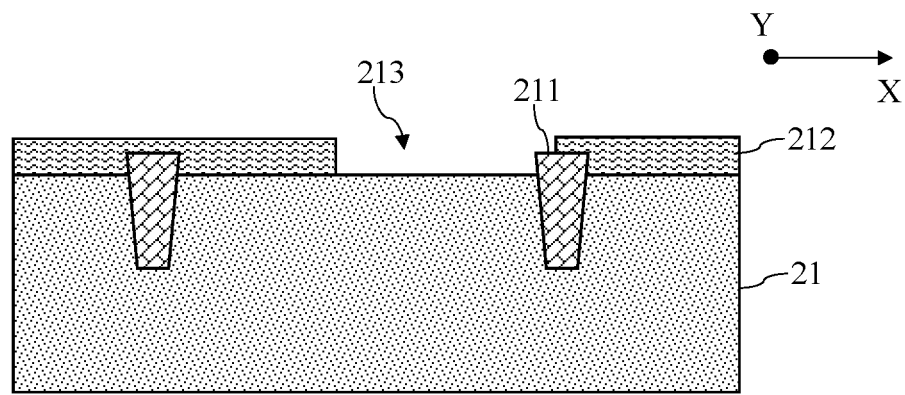
FIGS. 3a to 3b schematically illustrate a process of forming a drift region according to an embodiment of the present invention.

In Step S2, as shown in FIG. 3*a*, a patterned mask layer 212 is formed on the substrate 21. The patterned mask layer 212 has an opening 213 with a width increasing in a direction from a source region toward a drain region in the active area.

The width is measured in a widthwise direction (i.e., Y-direction) of a channel in the active area, and the direction from the source region toward the drain region is a lengthwise direction (i.e., X-direction) of the channel.

Figure 6A:
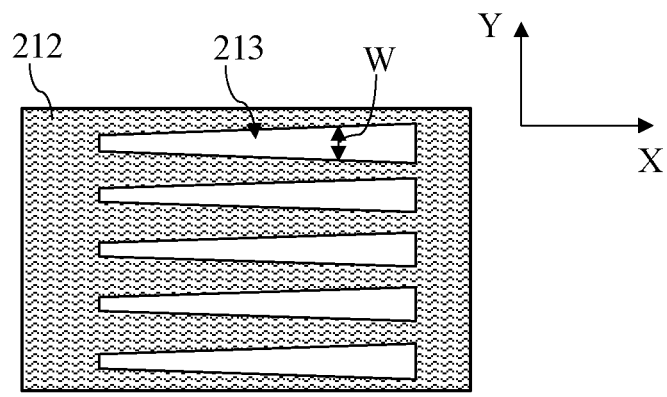
Figure 7A:
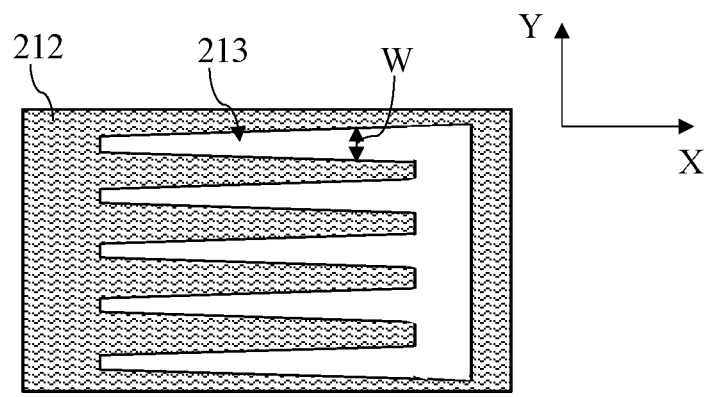

In some embodiments, as shown in FIGS. 6*a* and 7*a*, the opening 213 has an inverted trapezoidal shape tapered in the direction from the source region toward the drain region so that its width W increases in the same direction.

Alternatively, in some other embodiments, the opening 213 includes at least two portions with widths in increasing order in the direction from the source region toward the drain region. The width of each portion may either be constant across its length, or increase in the direction from the source region toward the drain region. For example, each portion may have a square, rectangular, inverted trapezoidal or other shape. Moreover, lengths of the individual portions in the direction from the source region toward the drain region may be either equal or not. In the embodiments shown in FIGS. 6*b* and 7*b*, the opening 213 includes three portions with widths W in increasing order in the direction from the source region toward the drain region. Each of the portions is rectangular and its width W remains constant across its length in the direction from the source region toward the drain region.

It is to be noted that possible shapes of the opening 213 are not limited to those as in the embodiments of in FIGS. 6*a* to 6*b* and 7*a* to 7*b*, and in other embodiments, sides of the opening 213 oriented in the direction from the source region toward the drain region may have a curved shape, a wavy shape or a polygonal shape, or a combination thereof.

Figure 6B:
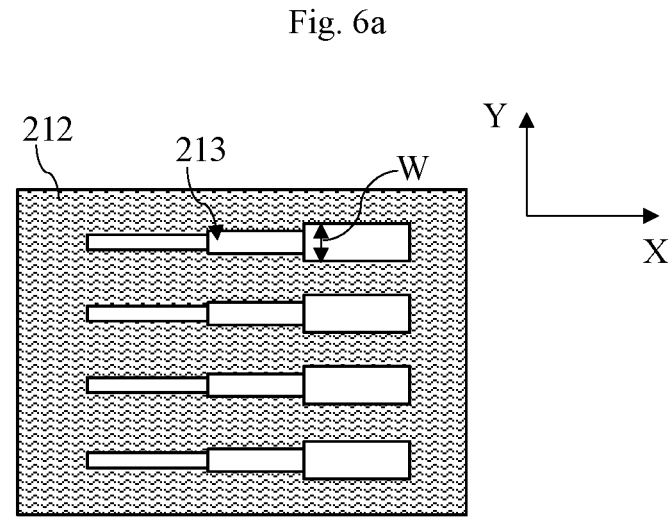
FIG. 6b is a schematic top view of a patterned mask layer formed by a photolithography process using the photomask of FIG. 4b.

Preferably, as shown in FIGS. 6*a* to 6*b*, the patterned mask layer 212 may have multiple openings 213 spaced apart in the widthwise direction of the channel in the active area.

Figure 7B:
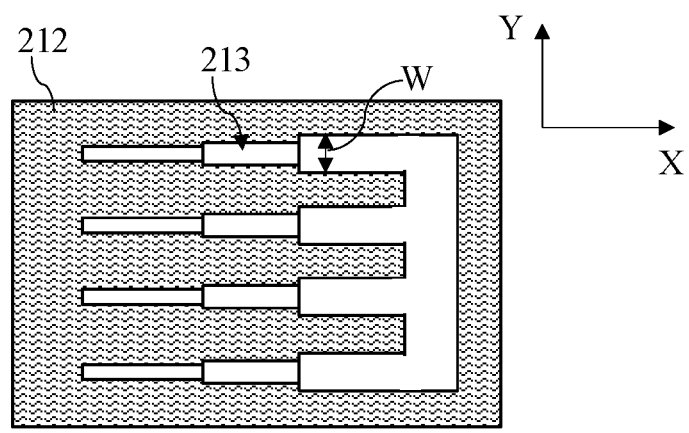
FIG. 7b is a schematic top view of a patterned mask layer formed by a photolithography process using the photomask of FIG. 5b.

In the case of the patterned mask layer 212 having multiple such spaced openings 213, preferably, as shown in FIGS. 7*a* to 7*b*, the individual openings 213 are interconnected at the end closer to the drain region while remaining separate at the end closer to the source region.

In addition, the step of forming the patterned mask layer 212 on the substrate 21 may include performing a photolithography process using a photomask on the mask layer to transfer the pattern from the photomask into the mask layer, resulting in the formation of the patterned mask layer 212.

The photomask has a light-shielding region and a light-transmitting region. In the case of the mask layer being positive photoresist, the light-transmitting region is aligned with the opening 213 in the patterned mask layer 212. In the case of the mask layer being negative photoresist, the light-shielding region is aligned with the opening 213 in the patterned mask layer 212.

In the case of the mask layer being positive photoresist, referring to FIGS. 4*a* to 4*b* and 5*a* to 5*b*, the light-transmitting region 32 has a width W1 increasing in the direction from the source region toward the drain region. When there are multiple light-transmitting regions 32, each light-shielding region 31 between any two adjacent light-transmitting regions 32 has a width W2 decreasing in the direction from the source region toward the drain region. In this way, as a result of the photolithography process, the pattern of the light-transmitting regions 32 is transferred into the mask layer, resulting in the formation of the patterned mask layer 212 as shown in FIGS. 6*a* to 6*b* and 7*a* to 7*b*, in which the width W of each opening 213 increases in the direction from the source region toward the drain region. As shown in FIGS. 5*a* to 5*b* and 7*a* to 7*b*, when the light-transmitting regions 32 are interconnected at the end closer to the drain region, the resulting openings 213 are also interconnected at the end closer to the drain region. At any position along the direction from the source region toward the drain region, the widths W1 and W are equal to each other.

Moreover, it is to be noted that the source and the drain regions are formed in a subsequent process.

Figure 3B:
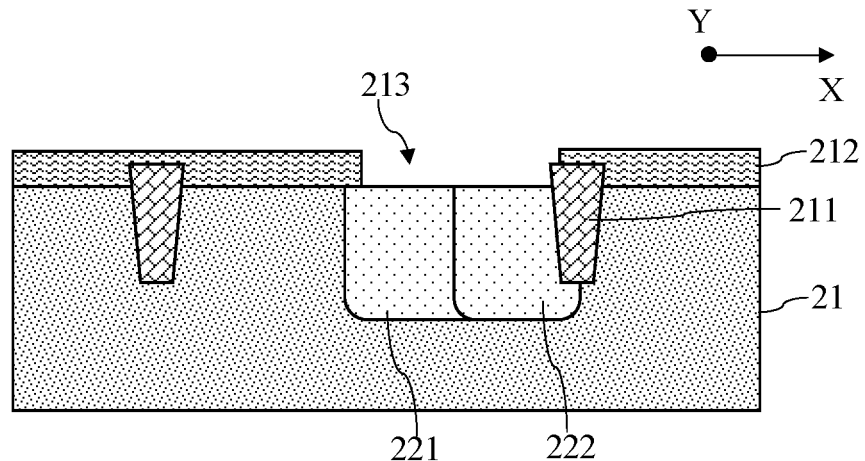
Figure 4A:
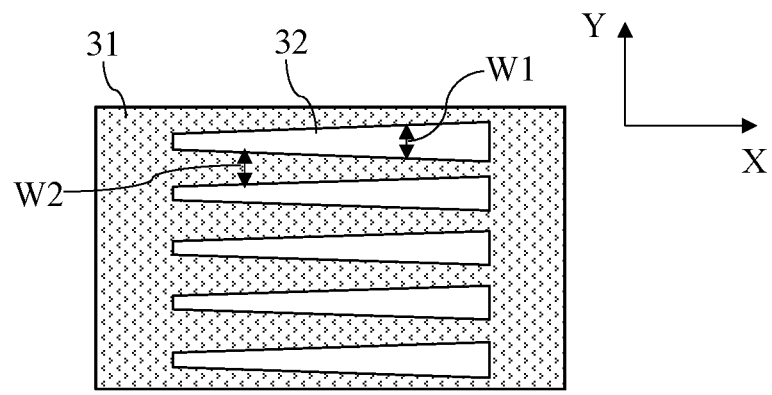
FIG. 4a is a schematic diagram showing the structure of a photomask according to a first embodiment of the present invention.
Figure 4B:
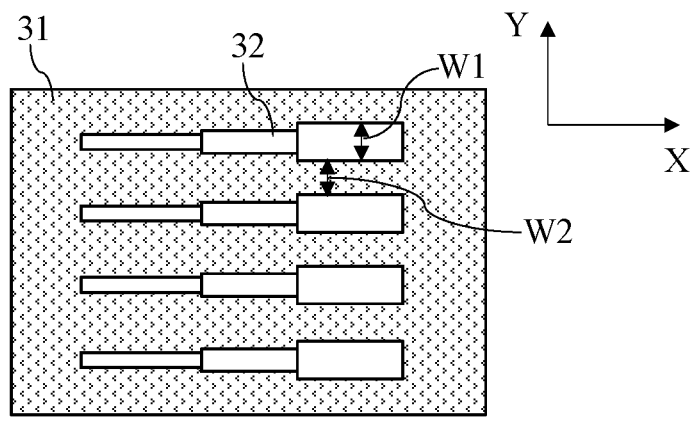
FIG. 4b is a schematic diagram showing the structure of a photomask according to a second embodiment of the present invention.
Figure 5A:
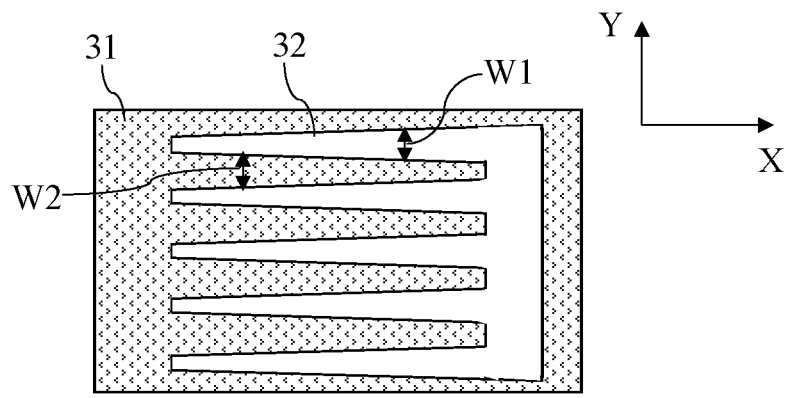
FIG. 5a is a schematic diagram showing the structure of a photomask according to a third embodiment of the present invention.
Figure 5B:
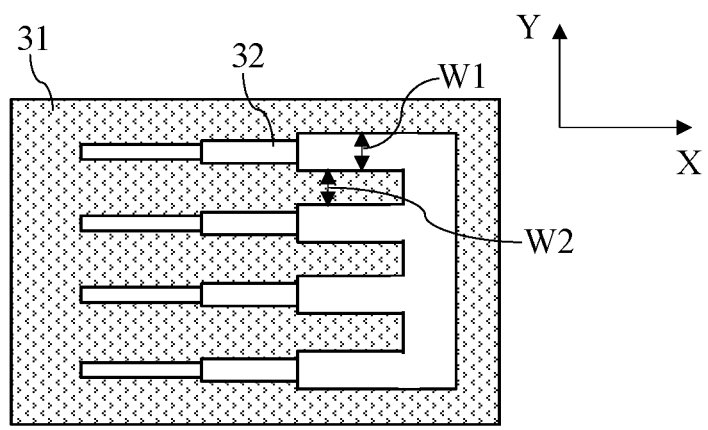
FIG. 5b is a schematic diagram showing the structure of a photomask according to a fourth embodiment of the present invention.

In Step S3, as shown in FIG. 3*b*, an ion implantation process is performed using the patterned mask layer 212 as a mask, resulting in the formation of a drift region in the substrate 21 in the active area. As the opening 213 in the patterned mask layer 212 increasingly widens in the direction from the source region toward the drain region, a dopant ion concentration increasing in the same direction is present in the drift region.

As ions implanted into the substrate 21 will diffuse into other portions of the substrate 21 surrounding the opening 213, in case of multiple openings 213, as a result of diffusion of ions implanted into the substrate 21 through all the openings 213, a continuous drift region can be formed.

In the embodiment shown in FIG. 3b, the opening 213 in the patterned mask layer 212 includes two portions with widths in increasing order in the direction from the source region toward the drain region. Accordingly, the drift region formed in the substrate 21 in the active area as a result of the ion implantation process includes a first drift region 221 closer to the source region and a second drift region 222 closer to the drain region. The first drift region 221 has a dopant ion concentration higher than that of the second drift region 222.

It is to be noted that the boundary line shown schematically between the first drift region 221 and the second drift region 222 in FIG. 3b is merely for the purpose of explaining the dopant ion concentration in the drift region increasing in the direction from the source region toward the drain region, but depending on the widths and shapes of the individual portions of the opening 213, there may be either a physical interface between the first drift region 221 and the second drift region 222 (i.e., there is an abrupt change in dopant ion concentration across the two regions) or not (i.e., there is a gradual ion concentration across the two regions without any abrupt change). In contrast, when the width of the opening 213 increases in the direction from the source region toward the drain region, there is a gradual dopant ion concentration throughout the whole drift region, and there is no physical interface in the drift region.

Further, although a uniform quantity of ions is implanted per unit area of the substrate 21 through the opening 213 in the single ion implantation process, since the width of the opening 213 increases in the direction from the source region toward the drain region, more ions are overall implanted into the substrate 21 through the opening 213 downstream than upstream along this direction. As a result, the dopant ion concentration of the drift region increases in the direction from the source region toward the drain region. Moreover, as the opening 213 increasingly widens in the direction from the source region toward the drain region, in the case of multiple openings 213, the portion of the substrate 21 sandwiched between any two adjacent openings 213, into which ions will diffuse from the portions under the sandwiching openings is tapered in the direction from the source region toward the drain region. This will facilitate the creation of an increasing dopant ion concentration in the drift region in the direction from the source region toward the drain region. In this case, an overall width of the multiple openings increases in the direction from the source region toward the drain region, the overall width refers to the total width of the multiple openings measured in the vertical direction from the source electrode to the drain electrode.

Additionally, in the case of multiple openings 213 being interconnected at the end closer to the drain region, an even greater total number of ions will be implanted around the same end, enabling the drift region to have a dopant ion concentration at this end that is high enough to impart a reduced on-resistance to the semiconductor device.

The method may further include an annealing process for enhancing external diffusion of the implanted ions from the opening 213 into the substrate 21. In this case, the ions implanted into the substrate 21 through each opening 213 can sufficiently diffuse in the widthwise direction of the channel in the active area so that a more uniform dopant ion concentration can be obtained in this direction. Moreover, since each sandwiched substrate portion into which ions will diffuse is tapered in the direction from the source region toward the drain region, the creation of an increasing dopant ion concentration in the drift region in the direction from the source region toward the drain region can be facilitated.

Further, in the case of multiple spaced openings 213 in the patterned mask layer 212, the greater the number of openings 213 in the widthwise direction of the channel in the active area, the more sufficiently the ions implanted into the portion of the substrate 21 corresponding to each opening 213 will diffuse in the same direction, and the more uniform a dopant ion concentration will be obtained in this direction. Preferably, the openings 213 have identical width profiles in the widthwise direction of the channel in the active area, in order to obtain an even uniform dopant ion concentration in the drift region in the same direction as a result of the annealing process.

In addition, in order to enable uniform diffusion of the ions implanted into the portion of the substrate 21 corresponding to each opening 213 and hence a uniform dopant ion concentration in the drift region in the widthwise direction of the channel in the active area, which can prevent an abnormal on-resistance or breakdown voltage, the width W of each opening 213 is preferred to range from 60 nm to 800 nm.

Additionally, the ion implantation process may be performed at a dose of $1E12$ $cm^{-2}$ to $1E13$ $cm^{-2}$ with energy in the range of 100 Key to 1 MeV. After the annealing process is performed, the drift region may have a dopant ion concentration in the range of from $1E16$ $cm^{-3}$ to $1E17$ $cm^{-3}$. It is to be noted that the dose, energy and the dopant ion concentration of the drift region are not limited to lying within the ranges given above. Rather, they can be selected from suitable ranges depending on desired performance of the device.

Before or after the drift region is formed in the substrate 21, the method may further include forming, in the substrate 21 in the active area, a bulk region 23 in contact with the drift region or not. In the embodiments shown in FIGS. 9a to 9b and 10 to 11, the bulk region 23 is formed in contact with the drift region. In other embodiments, in order to achieve a higher breakdown voltage, the extents of the bulk region 23 and the drift region may be adjusted so that the bulk region 23 is not in contact with the drift region.

Figure 9A:
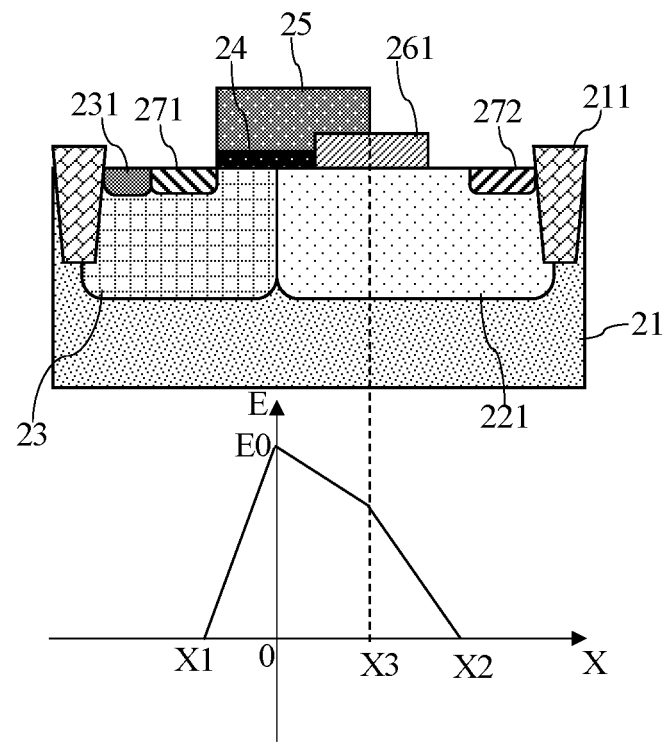
FIGS. 9a to 9b schematically illustrate how a semiconductor device fabricated in accordance with the first embodiment of the present invention has an increased breakdown voltage over another semiconductor device.
Figure 9B:
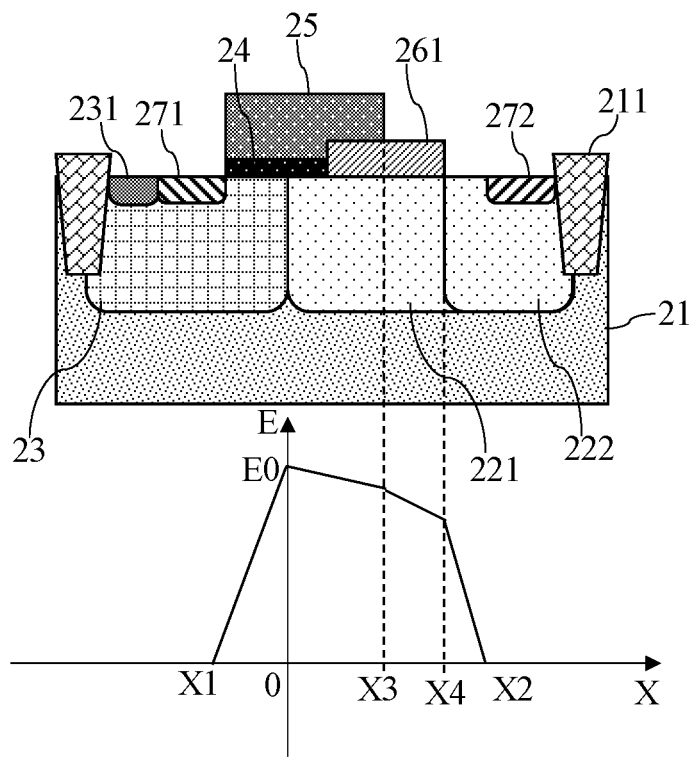

Furthermore, as shown in FIGS. 9a to 9b, the method may further include:

forming a gate dielectric layer 24 and a high-temperature oxide layer 261 on the substrate 21 in the active area, the high-temperature oxide layer 261 formed on the drift region, the gate dielectric layer 24 extending from above the drift region to above the bulk region 23, wherein the formation of the gate dielectric layer 24 may precede that of the high-temperature oxide layer 261, or the formation of the high-temperature oxide layer 261 may precede that of the gate dielectric layer 24, wherein the formation of the high-temperature oxide layer 261 may be accomplished with a high-temperature deposition process and the formation of the gate dielectric layer 24 by a thermal oxidation process, wherein the gate dielectric layer 24 may come into contact with the high-temperature oxide layer 261 on the side proximal to the high-temperature oxide layer 261, and wherein the high-temperature oxide layer 261 has a thickness that is greater than a thickness of the gate dielectric layer 24; and forming a gate layer 25 on both the gate dielectric layer 24 and part of the high-temperature oxide layer 261, the gate layer 25 is formed optionally by conventional deposition, photolithography and etching processes.

Figure 10:
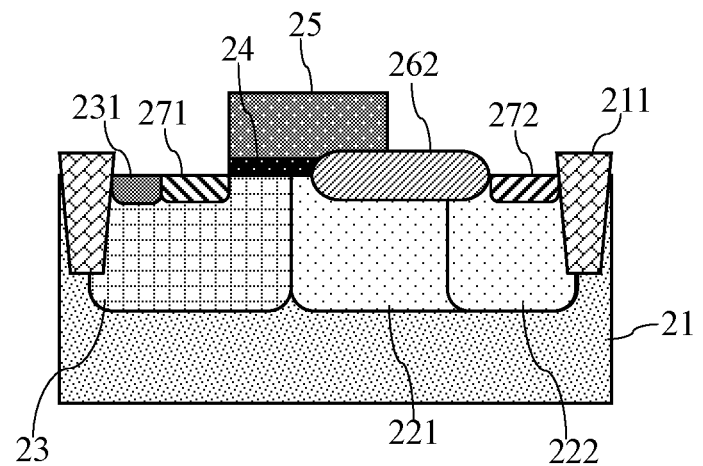
FIG. 10 is a schematic diagram showing the structure of a semiconductor device according to a second embodiment of the present invention.

Alternatively, as shown in FIG. 10, the method may further include:

forming a gate dielectric layer 24 on the substrate 21 in the active area and a local oxidation of silicon (LOCOS) structure 262 in the substrate 21 in the drift region, the LOCOS structure 262 having a top surface raised over the top surface of the substrate 21, the gate dielectric layer 24 extending from above the drift region to above the bulk region 23, wherein the formation of the gate dielectric layer 24 may precede that of the LOCOS structure 262, or the formation of the LOCOS structure 262 may precede that of the gate dielectric layer 24, wherein the formation of the LOCOS structure 262 may be accomplished with an LOCOS process and the formation of the gate dielectric layer 24 by a thermal oxidation process, and wherein the gate dielectric layer 24 may come into contact with the LOCOS structure 262 on the side proximal to the LOCOS structure 262; and forming a gate layer 25 on both the gate dielectric layer 24 and part of the LOCOS structure 262, the gate layer 25 is formed optionally by conventional deposition, photolithography and etching processes.

Figure 11:
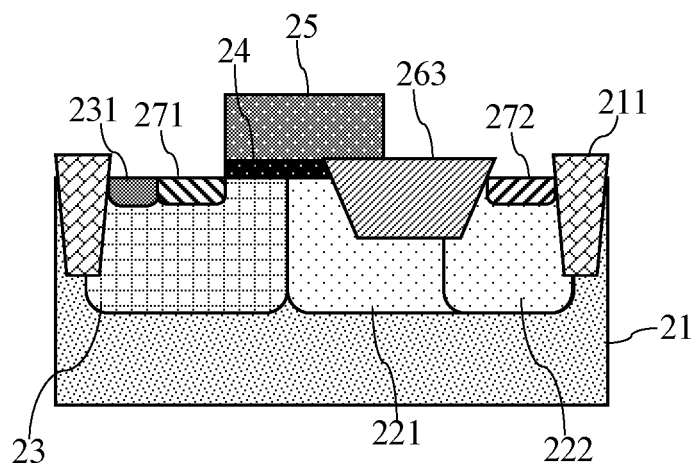
FIG. 11 is a schematic diagram showing the structure of a semiconductor device according to a third embodiment of the present invention.

Alternatively, as shown in FIG. 11, the method may further include:

forming a second trench isolation structure 263 in the substrate 21 in the drift region and a gate dielectric layer 24 on the substrate 21 in the active area, the gate dielectric layer 24 extending from above the drift region to above the bulk region 23, wherein the formation of the second trench isolation structure 263 may occur simultaneously with the formation of the first filled-trench structure 211 and precede the formation of the gate dielectric layer 24, wherein the formation of the gate dielectric layer 24 may be accomplished with a thermal oxidation process, and wherein the gate dielectric layer 24 may come into contact with the second trench isolation structure 263 on the side proximal to the second trench isolation structure 263; and forming a gate layer 25 on both the gate dielectric layer 24 and part of the second trench isolation structure 263, the gate layer 25 is formed optionally by conventional deposition, photolithography and etching processes.

Figure 8:
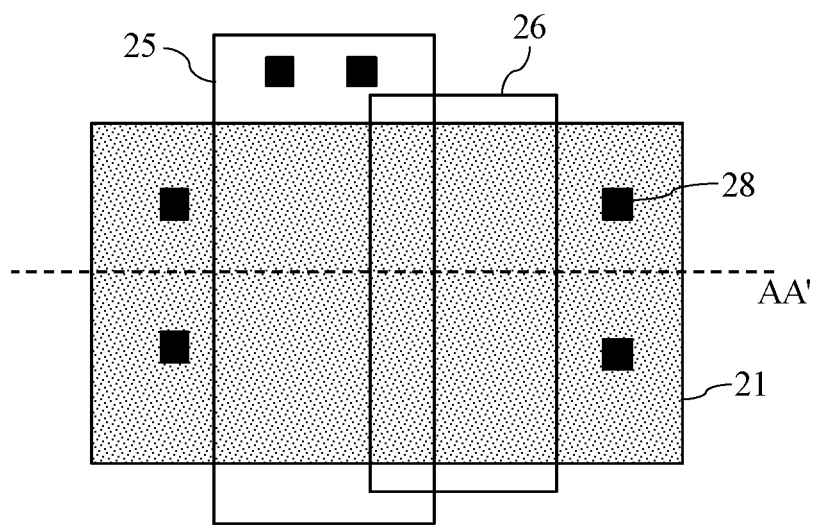
FIG. 8 is a layout diagram of a semiconductor device according to an embodiment of the present invention.

It is to be noted that the high-temperature oxide layer 261 shown in FIGS. 9a to 9b, the LOCOS structure 262 in FIG. 10 and the second trench isolation structure 263 in FIG. 11 all correspond to the field oxide layer 26 in FIG. 8. The portion of the gate layer 25 residing on the channel region defined in the layout provides a gate region of the semiconductor device, while the portion extending on the field oxide layer 26 provides a field plate.

In addition, referring to FIGS. 9a to 9b and 10 to 11, after the gate layer 25 is formed, the method may further include forming both the source region 271 and a bulk contact region 231 in the bulk region 23 and the drain region 272 in the drift region. Both the source region 271 and the bulk contact region 231 are located on the side of the gate dielectric layer 24 away from the field oxide layer 26, and the bulk contact region 231 is located on the side of the source region 271 away from the gate layer 25. The drain region 272 is located on the side of the field oxide layer 26 away from the gate dielectric layer 24. The source region 271 and the bulk contact region 231 may be either separated by the first filled-trench structure 211 or in contact with each other.

Referring to FIG. 8, the method may further include forming conductive plugs 28 on the source region 271, the drain region 272, the bulk contact region 231 and the gate layer 25.

As can be seen from the above description, with the method of the present invention, a dopant ion concentration increasing in the direction from the source region 271 toward the drain region 272 can be created in the drift region simply by a single photolithography process using only one photomask and a single ion implantation process, which imparts to the semiconductor device both a relatively low on-resistance and an increased breakdown voltage. Compared with the conventional method involving multiple photolithography processes using multiple photomasks and multiple ion implantation processes, the method of the present invention is simpler and less costly.

How the semiconductor device has both a relatively low on-resistance and an increased breakdown voltage will be described below in the context of the embodiments of FIGS. 9a and 9b, as an example.

A drift region formed as a result of an ion implantation process using a patterned photoresist layer (not shown) formed in the embodiment of FIG. 9a as a mask includes only a first drift region 221, the first drift region 221 has a constant dopant ion concentration in the direction from the source region 271 to the drain region 272. In the embodiment of FIG. 9b, a drift region formed as a result of Steps S1 to S3 includes a first drift region 221 and a second drift region 222. The first drift region 221 has a dopant ion concentration lower than that of the second drift region 222. That is, a dopant ion concentration increasing in the direction from the source region 271 to the drain region 272 is created in the drift region of FIG. 9b. Here, it is assumed that the drift regions of FIGS. 9a and 9b have equal areas (i.e., both equal lengths and equal widths). The drift region of FIG. 9a is formed as a direct result of ion implantation, and an opening in the patterned photoresist layer for implantation of ions therethrough has an area that is equal to the area of the drift region. In contrast, the drift region of FIG. 9b is formed as a result of ion implantation followed by a diffusion process, and the opening 213 in the patterned mask layer 212 has an area smaller than that of the drift region. The same total number of ions can be implanted to form the drift regions of FIGS. 9a and 9b by properly configuring doses at which the ions are implanted so that the implantation dose for the drift region of FIG. 9a is lower than the implantation dose for the drift region of FIG. 9b (in each case, the total number of implanted ions is equal to the implantation dose times the opening area).

Therefore, the total number of ions implanted in the ion implantation process and the length of the drift region measured in the direction from the source region 271 to the drain region 272 in embodiment of FIG. 9b are same as those in the embodiment of FIG. 9a. Since the same total number of ions is implanted, the total amounts of dopant and hence the total numbers of carriers in the drift regions are equal. Moreover, as the mobility of electrons, i.e., their velocity in the drift regions, is an invariable nature of electrons, the conductivities calculated as the respective products of the respective numbers of carriers and the mobility of electrons, as well as the on-resistances calculated as the respective conductivities and the respective lengths measured in the direction from the source region 271 to the drain region 272, of the two drift regions are equal.

However, given the same total number of ions implanted in the ion implantation processes and the same length of the drift regions in the direction from the source region 271 to the drain region 272, since the dopant ion concentration of the drift region (i.e., the first drift region 221) in FIG. 9a remains constant in the direction from the source region 271 to the drain region 272 while the dopant ion concentration of the drift region in FIG. 9b increases in the direction from the source region 271 to the drain region 272, the dopant ion concentration of the first drift region 221 of FIG. 9a is higher than the dopant ion concentration of the first drift region 221 of FIG. 9b and lower than the dopant ion concentration of the second drift region 222 of FIG. 9b.

FIGS. 9a and 9b also show curves of electric field intensity E versus position X in the direction from the source region 271 to the drain region 272. For each curve, the area delimited by a curve section corresponding to a portion of the semiconductor device, the abscissa axis X and lines parallel to the ordinate axis E drawn from points on the abscissa axis X corresponding to boundaries of the portion represents a breakdown voltage of the portion. As can be seen from the figures, the bulk regions 23 (corresponding to the range from X1 to 0) of FIGS. 9a and 9b have equal breakdown voltages, but the drift regions (corresponding to the range from 0 to X2) of them have different breakdown voltages. Specifically, for each semiconductor device, as the drift region and the bulk region 23 have opposite types of conductivity, they form a PN junction between them. At the center of the PN junction (i.e., the interface of the drift region and the bulk region 23, which corresponds to X=0), the electric field from the bulk region 23 to the drift region is most intense because of the number of positive charges is equal to that of negative charges. The electric field intensity decreases in both the directions from X=0 to X2 and to X1. Since the dopant ion concentration of the first drift region 221 in FIG. 9a remains constant in the direction from the source region 271 to the drain region 272, there is a point of inflection in the decreasing electric field intensity curve portion at the boundary of the gate layer 25 proximal to the drain region 272 (corresponding to X3). The point of inflection occurs because all positive charges in the portion of the first drift region 221 not covered by the gate layer 25 end up in the bulk region 23, while in the portion of the first drift region 221 covered by the gate layer 25, only some charges end up in the bulk region 23 and the remaining ones end up in the gate layer 25. As a result, the electric field intensity drops more rapidly from X3 to X2 than from 0 to X3, creating the point of inflection. In contrast, in the embodiment of FIG. 9b, since the dopant ion concentration of the first drift region 221 is lower than that of the second drift region 222, there is an additional point of inflection in the decreasing electric field intensity curve at the interface of the first drift region 221 and the second drift region 222 (corresponding to X4). Moreover, since the dopant ion concentration of the first drift region 221 in FIG. 9a is higher than the dopant ion concentration of the first drift region 221 in FIG. 9b, compared to that of FIG. 9a, the electric field intensity of FIG. 9b drops more slowly from 0 to X4, resulting in an increase in breakdown voltage. Although the electric field intensity of FIG. 9b drops more rapidly from X4 to X2 and leads to a decrease in breakdown voltage as compared to that of FIG. 9a because the dopant ion concentration of the first drift region 221 in FIG. 9a is lower than the dopant ion concentration of the second drift region 222 in FIG. 9b, as the lengths from 0 to X2 and the peak electric field intensities E0 are equal in FIGS. 9a and 9b, the drift region of FIG. 9b (0 to X2) has an overall increased breakdown voltage than that of FIG. 9a.

Thus, as can be known from the above analysis, compared with FIG. 9a, the dopant ion concentration increasing from source region 271 to the drain region 272 created in the drift region can impart both a relatively low on-resistance and an increased breakdown voltage to the semiconductor device according to the embodiment of FIG. 9b.

In summary, the present invention provides a method of fabricating a semiconductor device, which includes: providing a substrate; forming a patterned mask layer on the substrate; and forming a drift region in the substrate by performing an ion implantation process using the patterned mask layer as a mask, wherein the patterned mask layer has an opening with a width increasing in a direction from a source region toward a drain region, as a result of which a dopant ion concentration increasing in the direction from the source region toward the drain region is created in the drift region. This method can be used to make a semiconductor device having both a relatively low on-resistance and an increased breakdown voltage with a simplified process at reduced cost.

In an embodiment of the present invention, there is also provided a semiconductor device fabricated using the above method. Therefore, it has both a relatively low on-resistance and an increased breakdown voltage, and the fabrication can be achieved with a simplified process at reduced cost.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A method of fabricating a semiconductor device, comprising:
   providing a substrate;
   forming a patterned mask layer on the substrate; and
   forming a drift region in the substrate by performing an ion implantation process using the patterned mask layer as a mask, wherein the patterned mask layer has at least one opening with an overall width increasing in a direction from a source region toward a drain region, thereby a dopant ion concentration in the drift region increasing in the direction from the source region toward the drain region.

2. The method of claim 1, wherein the opening(s) has/have an inverted trapezoidal shape tapered in the direction from the source region toward the drain region.

3. The method of claim 1, wherein the opening(s) has/have at least two portions with widths in increasing order in the direction from the source region toward the drain region.

4. The method of claim 1, wherein the patterned mask layer has a plurality of openings arranged at intervals.

5. The method of claim 4, wherein each of the plurality of openings is interconnected at an end proximal to the drain region.

6. The method of claim 1, further comprising:
   performing an annealing process to cause the implanted ions to diffuse into the substrate surrounding the opening(s).

7. The method of claim 1, wherein the substrate is provided thereon with a mask layer, and the step of forming the patterned mask layer on the substrate comprises:

performing a photolithography process using a photomask on the mask layer so that the pattern is transferred from the photomask into the mask layer, thereby forming the patterned mask layer.

8. The method of claim 7, wherein the photomask has a light-shielding region and a light-transmitting region, wherein when the mask layer is positive photoresist, the light-transmitting region has a width increasing in the direction from the source region toward the drain region, and wherein when the mask layer is negative photoresist, the light-shielding region has a width increasing in the direction from the source region toward the drain region.

9. The method of claim 1, wherein the substrate is formed therein with an active area surrounded by a first filled-trench structure, and wherein the method further comprises:
forming a bulk region in the substrate in the active area.

10. The method of claim 9, further comprising:
forming a gate dielectric layer and a high-temperature oxide layer on the substrate in the active area, the high-temperature oxide layer formed on the drift region, the gate dielectric layer extending from above the drift region to above the bulk region; and
forming a gate layer on the gate dielectric layer, and the gate layer extending above part of the high-temperature oxide layer.

11. The method of claim 9, further comprising:
forming a gate dielectric layer on the substrate in the active area and a local oxidation of silicon (LOCOS) structure in the substrate in the drift region, the LOCOS structure having a top surface raised over a top surface of the substrate, the gate dielectric layer extending from above the drift region to above the bulk region; and forming a gate layer on the gate dielectric layer, and the gate layer extending above part of the LOCOS structure.

12. The method of claim 9, further comprising:
forming a second trench isolation structure in the substrate in the drift region and a gate dielectric layer on the substrate in the active area, the gate dielectric layer extending from above the drift region to above the bulk region; and
forming a gate layer on the gate dielectric layer, and the gate layer extending above part of the second trench isolation structure.

13. The method of claim 10, further comprising:
forming the source region and a bulk contact region in the bulk region and forming the drain region in the drift region, the bulk contact region located on a side of the source region away from the gate layer.

14. The method of claim 11, further comprising:
forming the source region and a bulk contact region in the bulk region and forming the drain region in the drift region, the bulk contact region located on a side of the source region away from the gate layer.

15. The method of claim 12, further comprising:
forming the source region and a bulk contact region in the bulk region and forming the drain region in the drift region, the bulk contact region located on a side of the source region away from the gate layer.

16. A semiconductor device fabricated by the method of claim 1.

* * * * *